United States Patent
Cai et al.

(10) Patent No.: US 8,716,807 B2
(45) Date of Patent: May 6, 2014

(54) FABRICATION OF DEVICES HAVING DIFFERENT INTERFACIAL OXIDE THICKNESS VIA LATERAL OXIDATION

(75) Inventors: Jin Cai, Cortlandt Manor, NY (US); Eduard A. Cartier, New York, NY (US); Martin M. Frank, Dobbs Ferry, NY (US); Marwan H. Khater, Astoria, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/571,521

(22) Filed: Aug. 10, 2012

(65) Prior Publication Data
US 2012/0306019 A1    Dec. 6, 2012

Related U.S. Application Data

(62) Division of application No. 13/073,110, filed on Mar. 28, 2011, now Pat. No. 8,304,306.

(51) Int. Cl.
*H01L 21/70* (2006.01)

(52) U.S. Cl.
USPC ........... 257/369; 257/392; 257/394; 257/395; 257/396; 257/402; 257/E21.625; 257/E21.632; 257/E21.639

(58) Field of Classification Search
USPC .......... 257/369, 392, 394–396, 402, E21.625, 257/E21.632, E21.639
See application file for complete search history.

(56) References Cited

U.S. PATENT DOCUMENTS

| | | | |
|---|---|---|---|
| 6,544,845 B2 | 4/2003 | Yoo et al. | |
| 7,488,656 B2 | 2/2009 | Cartier et al. | |
| 7,696,036 B2 | 4/2010 | Bu et al. | |
| 7,709,331 B2 * | 5/2010 | Karve et al. | 438/275 |
| 2003/0207555 A1 | 11/2003 | Takayanagi et al. | |
| 2006/0246651 A1 | 11/2006 | Chambers et al. | |
| 2008/0194092 A1 | 8/2008 | Kaushik | |
| 2009/0108294 A1 | 4/2009 | Choi et al. | |
| 2009/0289306 A1 | 11/2009 | Watanabe et al. | |
| 2009/0291553 A1 | 11/2009 | Doris et al. | |
| 2010/0019313 A1 | 1/2010 | Kerber et al. | |
| 2010/0025770 A1 | 2/2010 | Trentzsch et al. | |
| 2010/0038641 A1 | 2/2010 | Imai | |
| 2011/0133280 A1 | 6/2011 | Bangsaruntip et al. | |
| 2011/0147854 A1 | 6/2011 | Nandakumar et al. | |
| 2011/0165767 A1 | 7/2011 | Bojarczuk et al. | |
| 2011/0175168 A1 * | 7/2011 | Wang et al. | 257/369 |

OTHER PUBLICATIONS

Brunet et al., "New Insight on VT Stability of HK/MG Stacks with Scaling in 30nm FDSOI Technology", 2010 Symposium on VLSI Technology, Jun. 15, 2010, pp. 29-30.
Cartier et al., "Role of Oxygen Vacancies in VFB/Vt Stability of pFET metals on HfO2", 2005 Symposium on VLSI Technology, Jun. 14-16, 2005, pp. 230-231.

(Continued)

*Primary Examiner* — Bac Au
(74) *Attorney, Agent, or Firm* — Cantor Colburn LLP; Vazken Alexanian

(57) ABSTRACT

A semiconductor device includes a first field effect transistor (FET) and a second FET located on a substrate, the first FET comprising a first interfacial oxide layer, and the second FET comprising a second interfacial oxide layer, wherein the second interfacial oxide layer of the second FET is thicker than the first interfacial oxide layer of the first FET; and a recess located in the substrate adjacent to the second FET.

6 Claims, 12 Drawing Sheets

(56) References Cited

OTHER PUBLICATIONS

Cartier et al., "pFET Vt Control with HfO2/TiN/Poly-Si Gate Stack Using a Lateral Oxygenation Process", 2009 Symposium on VLSI Technology, Jun. 16-18, 2009, pp. 42-43.

Kaushik et al., "Threshold Voltage Control In Polysilicon or Fully-Silicided-Hf-Based Gate Dielectric pMOSFETs Using Controlled Lateral Oxidation", ECS Transactions, vol. 1, No. 5, 2006, pp. 305-310.

* cited by examiner

FABRICATION OF DEVICES HAVING DIFFERENT INTERFACIAL OXIDE THICKNESS VIA LATERAL OXIDATION

CROSS-REFERENCE TO RELATED APPLICATION

This application is a divisional of U.S. application Ser. No. 13/073,110, filed on Mar. 28, 2011, the disclosure of which is incorporated by reference herein in its entirety.

BACKGROUND

This disclosure relates generally to the field of semiconductor device fabrication, and more particularly to formation of complementary metal oxide semiconductor (CMOS) devices having interfacial oxide of different thicknesses on the same chip or substrate.

State of the art integrated circuit (IC) chips must be able to allow a wide range of on-chip voltages across devices on the chip, while increasing circuit performance and design flexibility. An increasing demand exists for providing semiconductor chips having devices, such as field effect transistors (FETs), with interfacial oxide layers of various thicknesses. Interfacial oxide thickness between the device gate and the substrate on which the device is located is a major concern in terms of reliability considerations for devices operating at different voltage levels. Device scaling trends have led to low voltage operation in devices having relatively thin interfacial oxides, such as devices that are used for memory or logic. Other applications may require a relatively thick interfacial oxide, such as driver/receiver circuitry at a chip input/output (I/O) and analog output devices. Thick interfacial oxide is necessary for high voltage devices to ensure reliability, while thin interfacial oxide is desirable for the relatively fast logic devices that use low voltages at the gate. However, the use of relatively thick interfacial oxide for lower voltage devices can cause poor device performance and significantly decrease speed.

Moreover, with the trend of to forming as many different circuits as possible on the same substrate, or chip, to achieve more functionality and/or improve performance, there are even more different possible combinations for different parts of circuits in the same chip to have different interfacial oxide thicknesses to achieve the optimized performance and reliability at the system level.

One method of forming different interfacial oxide thicknesses on the same substrate involves multiple masking, strip, and oxide formation steps. However, such an approach may significantly increase the overall manufacturing cost and degrade the reliability and yield of the manufacturing process. The interfacial oxide thickness may also be difficult to control because the thick oxide layer results from the combination of multiple oxide formation cycles.

Another method for providing multiple interfacial oxide thicknesses employs a nitrogen implant for retarding the oxidation rate on the thin interfacial oxide devices, while permitting a thicker oxide to grow where the nitrogen implant has been blocked. However, the use of nitrogen implants may cause problems. For example, implanting nitrogen at high doses may introduce beam damage in the channel region of FET devices. This damage in turn results in changes in the channel impurity distributions as well as introducing silicon defects which can degrade sub-threshold voltage leakage (off current), interfacial oxide breakdown voltage, and device reliability.

BRIEF SUMMARY

In one aspect, a semiconductor device includes a first field effect transistor (FET) and a second FET located on a substrate, the first FET comprising a first interfacial oxide layer, and the second FET comprising a second interfacial oxide layer, wherein the second interfacial oxide layer of the second FET is thicker than the first interfacial oxide layer of the first FET; and a recess located in the substrate adjacent to the second FET.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of methods for fabrication of devices having different interfacial oxide thicknesses via lateral oxidation, and a substrate including devices having different interfacial oxide thicknesses, are provided, with exemplary embodiments being discussed below in detail. Lateral oxidation may be used to increase the interfacial oxide thickness of devices selected to have a relatively thick interfacial oxide on a substrate. Other devices selected to have a relatively thin interfacial oxide on the substrate are protected during the lateral oxidation of the thick gate oxide devices. Lateral oxidation may be performed at a relatively high temperature, which may be about 700° C. in some embodiments. The lateral oxidation time period may be relatively long, about an hour in some embodiments, and the lateral oxidation process may include a relatively slow ramp up to the lateral oxidation temperature.

Figure 1A:
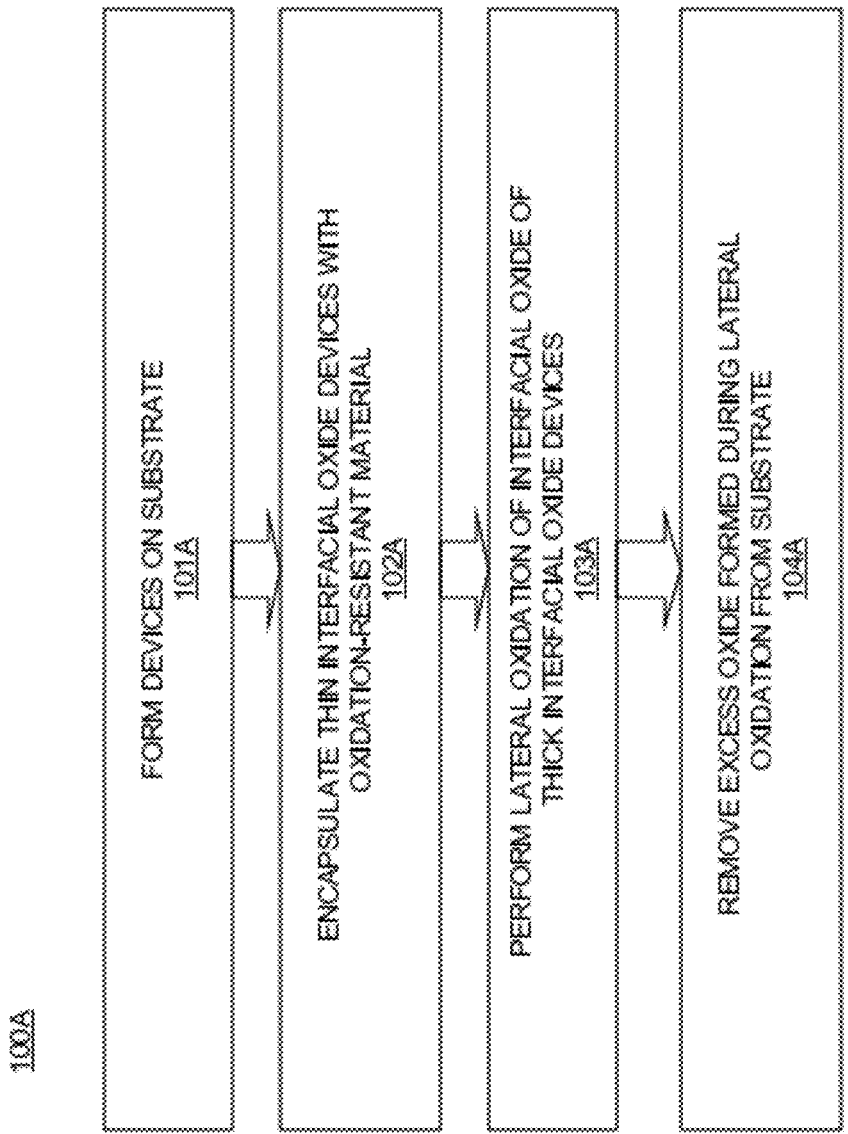
FIGS. 1A-B are flowcharts illustrating embodiments of methods for fabrication of devices having different interfacial oxide thicknesses via lateral oxidation.
Figure 2:
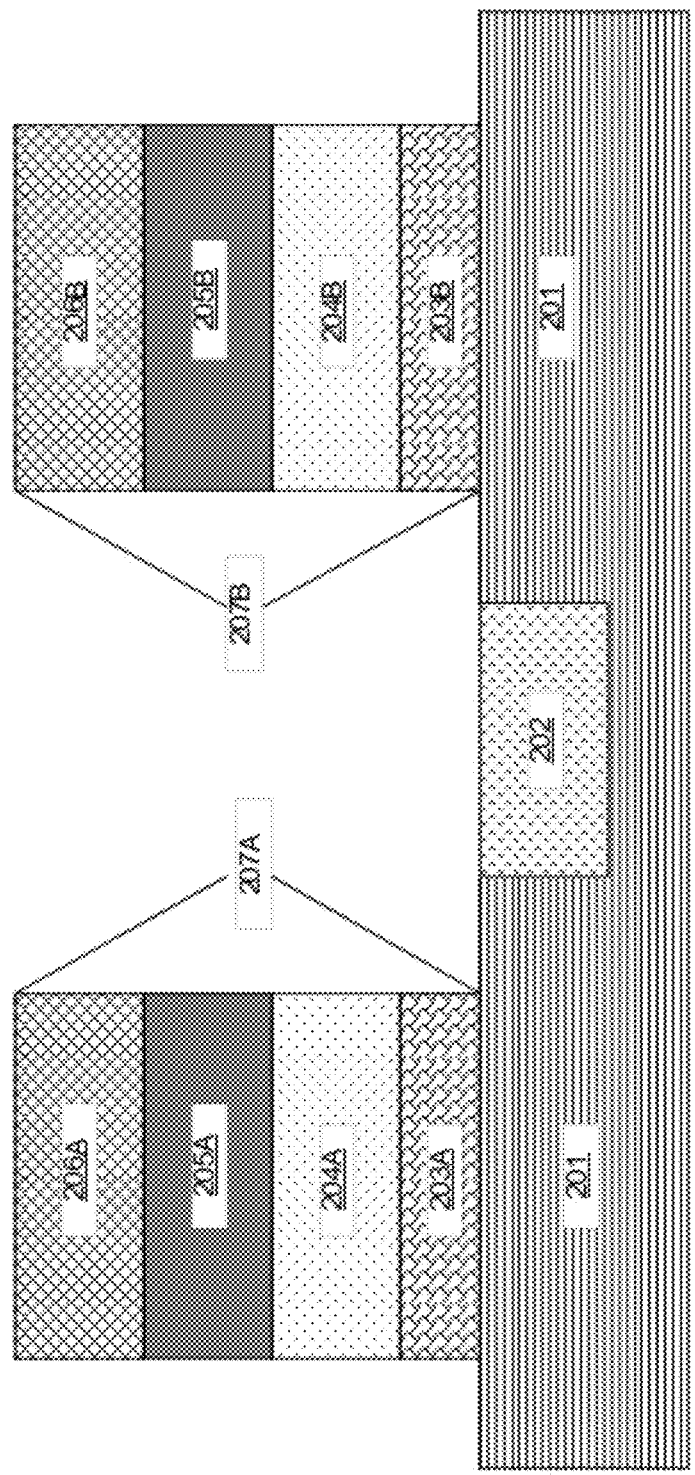
FIG. 2 is a cross sectional view illustrating an embodiment of devices formed on a substrate.

FIG. 1A illustrates an embodiment of a method 100A for fabrication of devices having different interfacial oxide thicknesses via lateral oxidation. FIG. 1A is discussed with reference to FIGS. 2-5. In block 101A, a plurality of devices are formed on a substrate, such as the devices shown in FIG. 2. FIG. 2 shows a cross section of a chip 200 that includes a first device 207A, including interfacial oxide 203A, dielectric layer 204A, gate metal 205A, and gate silicon 206A, and a second device 207B, including interfacial oxide 203B, dielectric layer 204B, gate metal 205B, and gate silicon 206B. First device 207A is a thin interfacial oxide device, and second device 207B is a thick interfacial oxide device. The first device 207A and second device 207B are both located on substrate 201, and are separated by a shallow trench isolation (STI) region 202. Interfacial oxide 203A-B may include but is not limited to silicon oxide ($SiO_2$) or silicon oxynitride (SiON) in some embodiments, and may be formed by growing the oxide on the substrate 201. High-k dielectric 204A-B may include but is not limited to hafnium oxide ($HfO_2$), hafnium silicate (HfSiO), hafnium silicon oxynitride (HfSiON), zirconium oxide ($ZrO_2$), zirconium silicate (ZrSiO), zirconium silicon oxynitride (ZrSiON), aluminum oxide ($Al_2O_3$), lanthanum oxide ($La_2O_3$), dysprosium oxide ($Dy_2O_3$), or mixtures or multilayers thereof, in various embodiments, and may be formed by deposition. High-k dielectric materials that allow for relatively facile diffusion of oxidizing species, such as $HfO_2$, may be used in some exemplary embodiments for high k dielectric 204A-B. Gate metal 205A-B may include but is not limited to titanium nitride (TiN), tantalum nitride (TaN), or tungsten (W) in some embodiments, and may be formed by deposition. Gate silicon 206A-B may include polysilicon or amorphous silicon in various embodiments. Substrate 201 may include but is not limited to silicon or silicon germanium.

Figure 3:
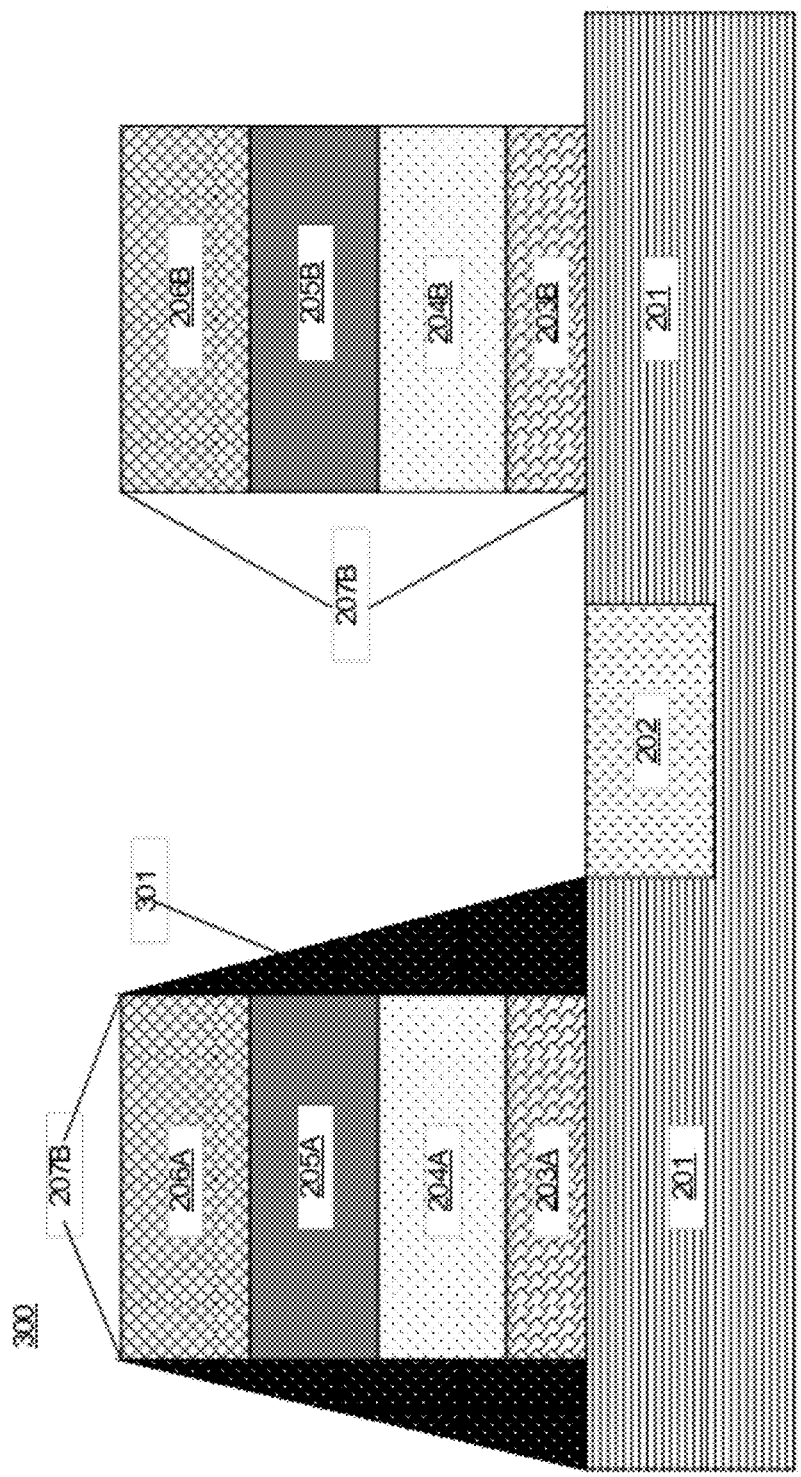
FIG. 3 is a cross sectional view illustrating an embodiment the device of FIG. 2 after encapsulation of the thin interfacial oxide device.

In block 102A, any devices on the substrate selected to have relatively thin interfacial oxide are encapsulated with an oxidation-resistant material. As shown in FIG. 3, first device 207A, including interfacial oxide 203A, is encapsulated by a spacer comprising an oxidation-resistant material 301. Oxidation-resistant material 301 may include a nitride such as silicon nitride ($Si_3N_4$), and may be formed by deposition of the oxidation-resistant material, photoresist and/or hardmask patterning followed by reactive ion etching to form the spacer, and wet removal of any oxidation-resistant material formed on the thick interfacial oxide devices, such as second device 207B.

Figure 4:
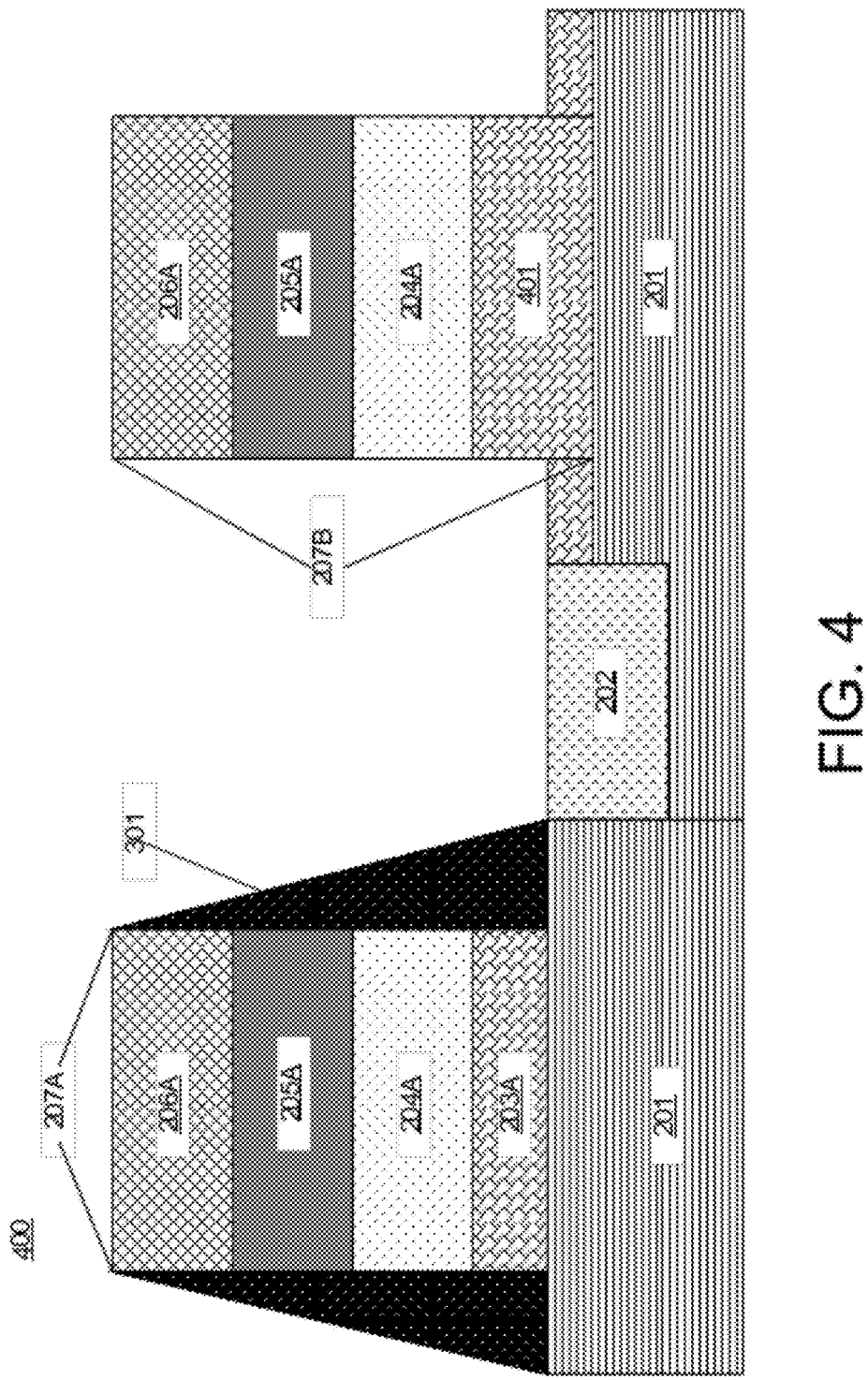
FIG. 4 is a cross sectional view illustrating an embodiment the device of FIG. 3 after lateral oxidation of the interfacial oxide of the thick interfacial oxide device.

In block 103A, lateral oxidation of the interfacial oxide 203B of second device 207B is performed, resulting in the device 400 as shown in FIG. 4 including thick interfacial oxide 401 in second device 207B. The lateral oxidation of block 103A converts a portion of substrate 201 that is located underneath second device 207B into interfacial oxide for second device 207B, and also forms excess oxide in substrate 201 adjacent to second device 207B. Conditions for the lateral oxidation of block 103A may be chosen such that the interfacial oxide 401 grows into substrate 201 by a pre-determined amount. The lateral oxidation may be performed in a chamber at a low oxygen partial pressure at an appropriately chosen temperature in a range from about 400° C. to about 800° C. (about 700° C. in some embodiments), such that lateral diffusion of oxygen into the gate stack of second device 207B is sufficiently rapid compared to the oxidation rate of the substrate 201 to nearly equilibrate the effective oxygen partial pressure in the stack across the second device 207B. The lateral oxidation of block 103A may include an initial slow temperature ramp-up in an environment that contains the low partial pressures of oxygen. The lateral oxidation time, including the relatively slow ramp up to the relatively high temperature, may be in a range from about 1 minute to about 1 day (about 1 hour in some embodiments). The lateral oxidation time and temperature may be adjusted depending on the gate length of the thick interfacial oxide devices. A high temperature and a relatively long time period for the lateral oxidation of block 103A allows for formation of thickened interfacial oxide, such as interfacial oxide 401, for devices having relatively large gate lengths.

Figure 5:
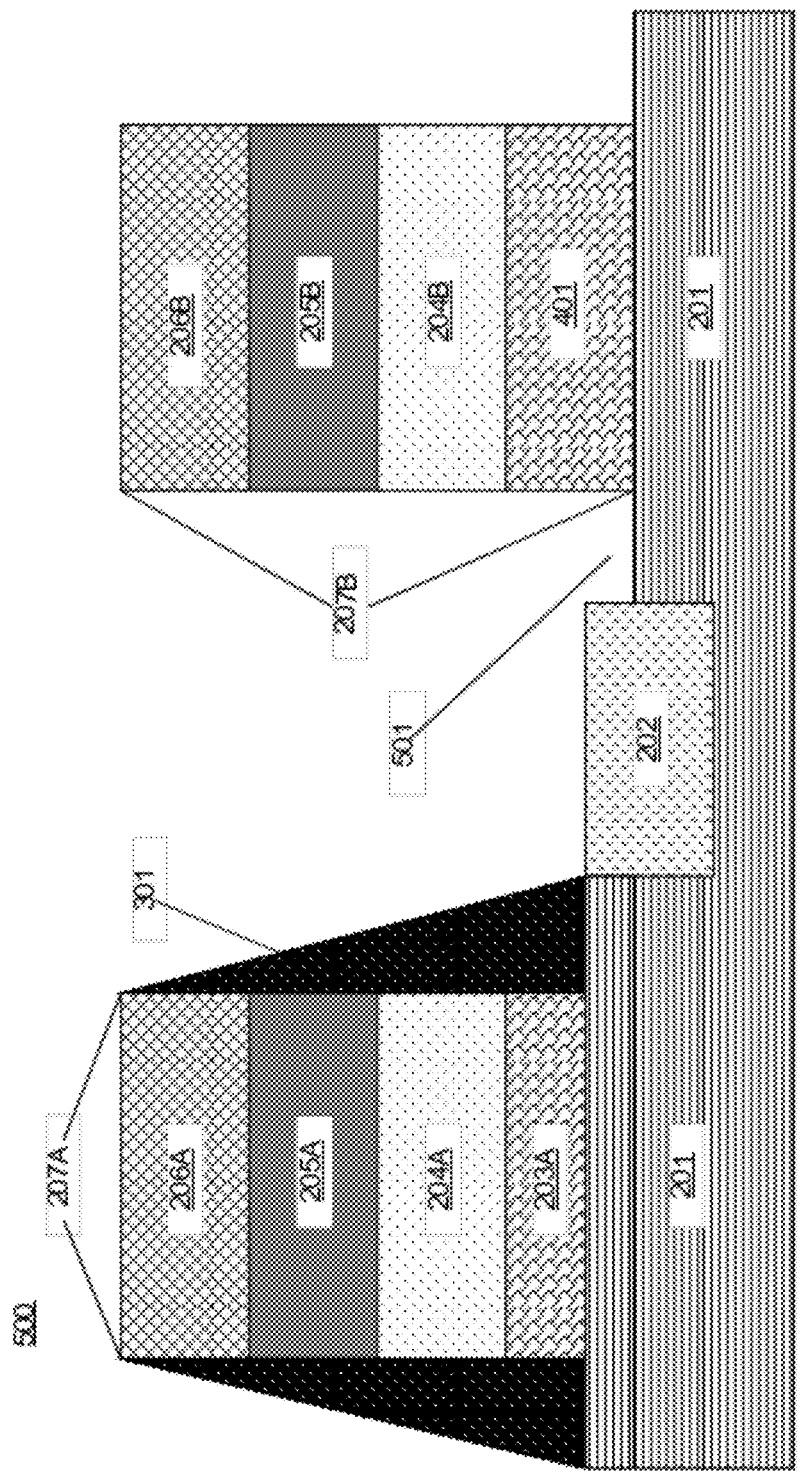
FIG. 5 is a cross sectional view illustrating an embodiment the device of FIG. 4 after removal of excess oxide from the substrate.

Lastly, in block 104A, the excess oxide formed in block 103A adjacent to second device 207B is removed from substrate 201, forming recesses 501 adjacent to second device 207B in the substrate 201, as shown in FIG. 5. After the excess oxide is removed to form recesses 501, oxidation-resistant material 301 may be removed from first device 207A, and gate silicon 206A-B and source/drain regions in substrate 201 adjacent to devices 207A-B may be silicided in some embodiments; source/drain silicide for second device 207B is formed in recesses 501. After formation of the gate and source/drain silicide, spacers (not shown) may then be formed on both first device 207A and second device 207B.

Figure 1B:
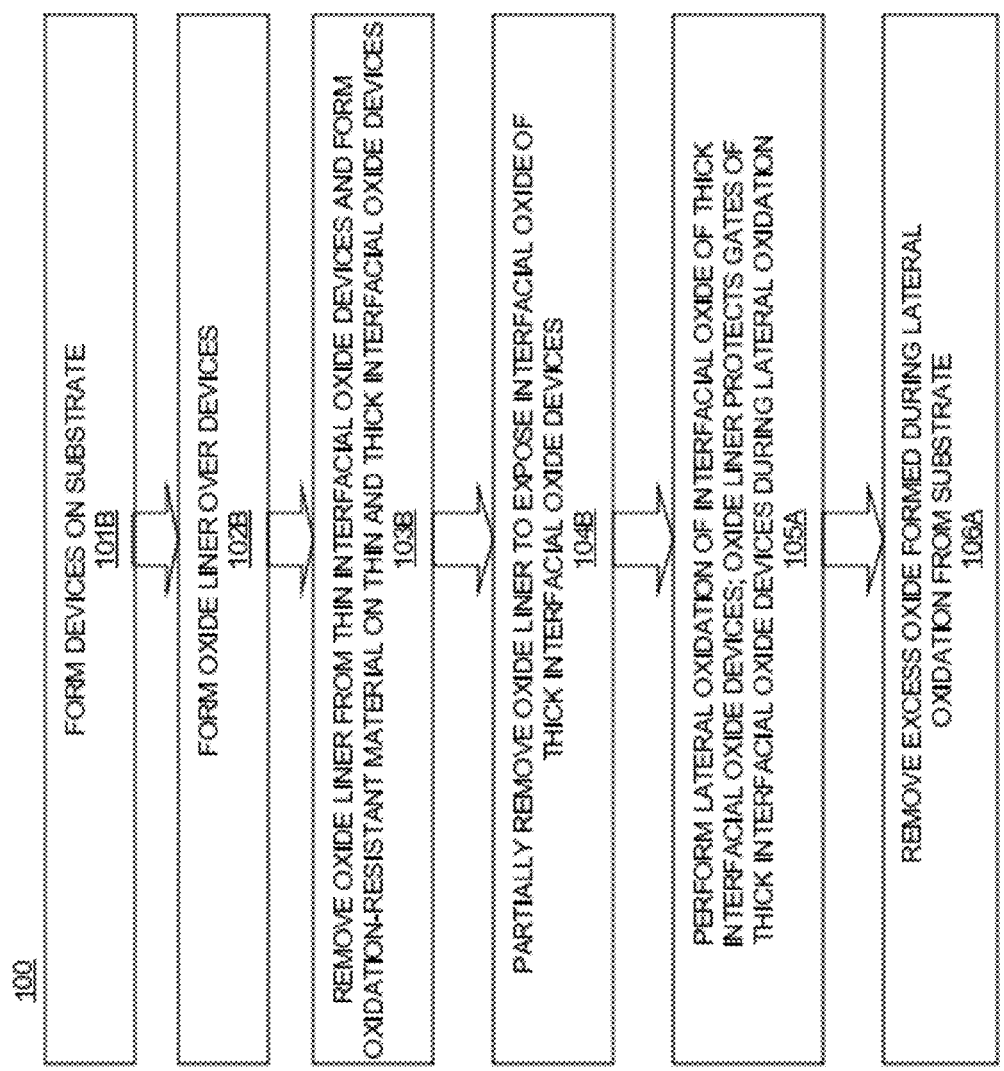
Figure 6:
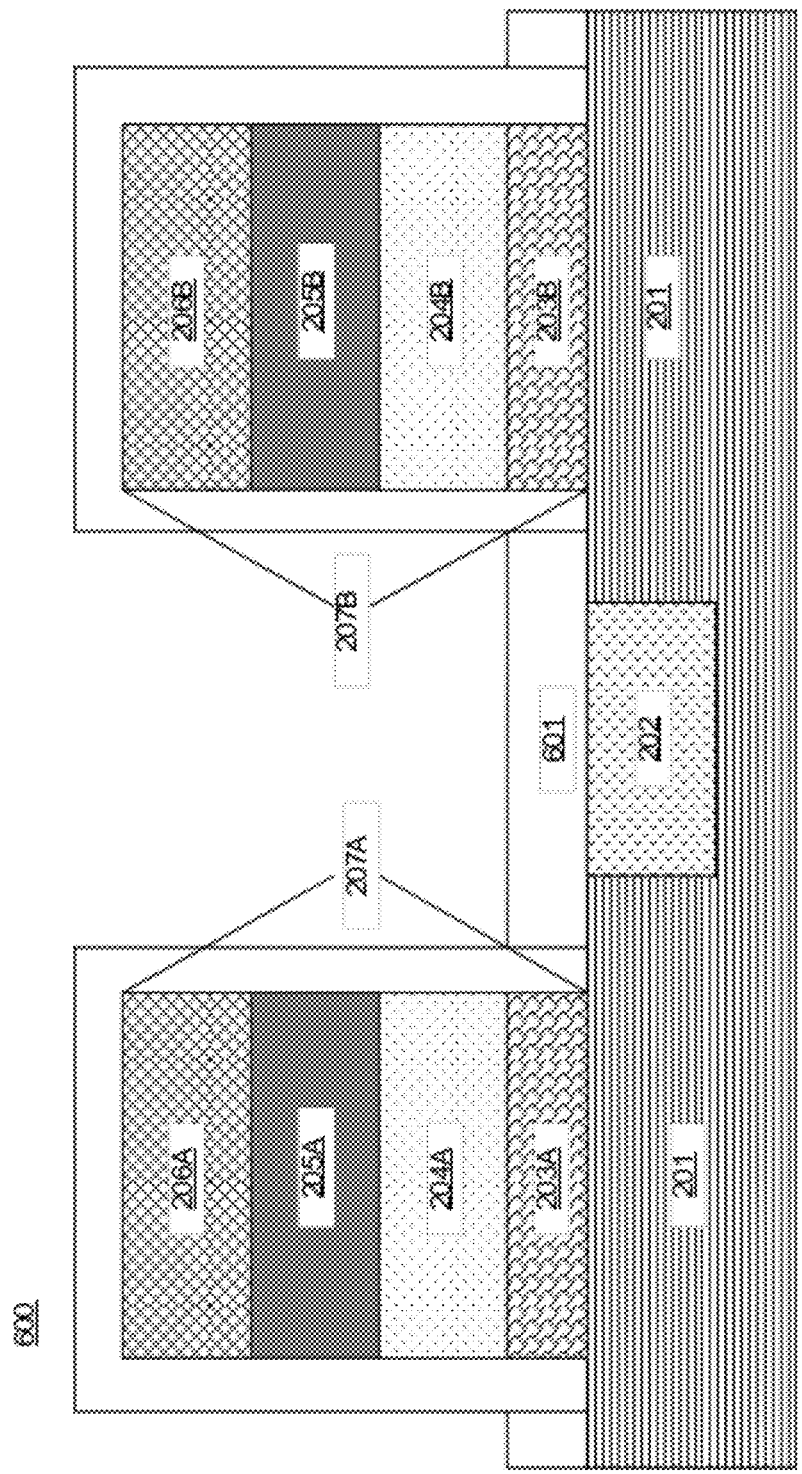
FIG. 6 is a cross sectional view illustrating an embodiment the device of FIG. 2 after oxide liner deposition.
Figure 7:
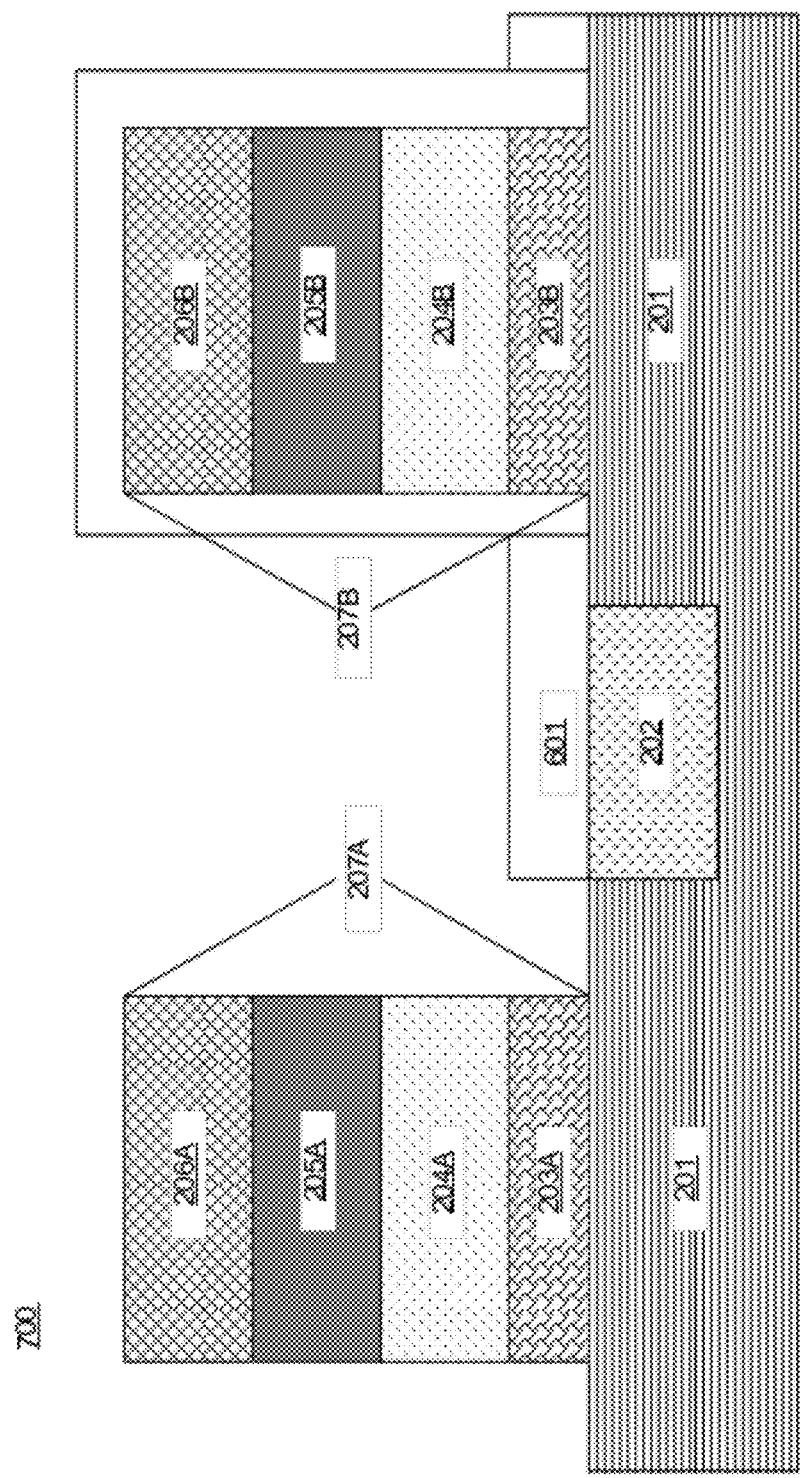
FIG. 7 is a cross sectional view illustrating an embodiment the device of FIG. 6 after removal of the oxide liner from the thin interfacial oxide device.
Figure 8:
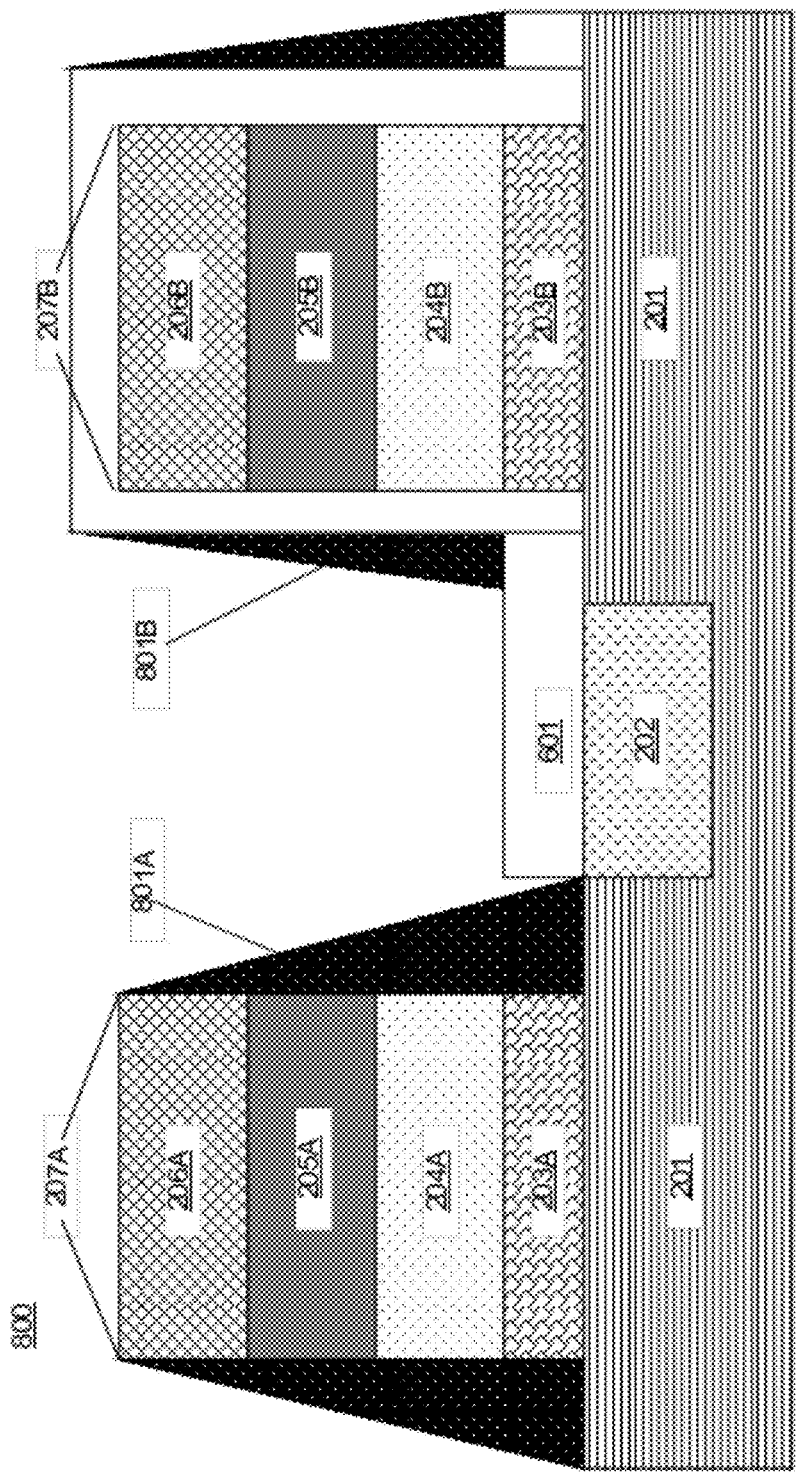
FIG. 8 is a cross sectional view illustrating an embodiment the device of FIG. 7 after nitride spacer formation.
Figure 9:
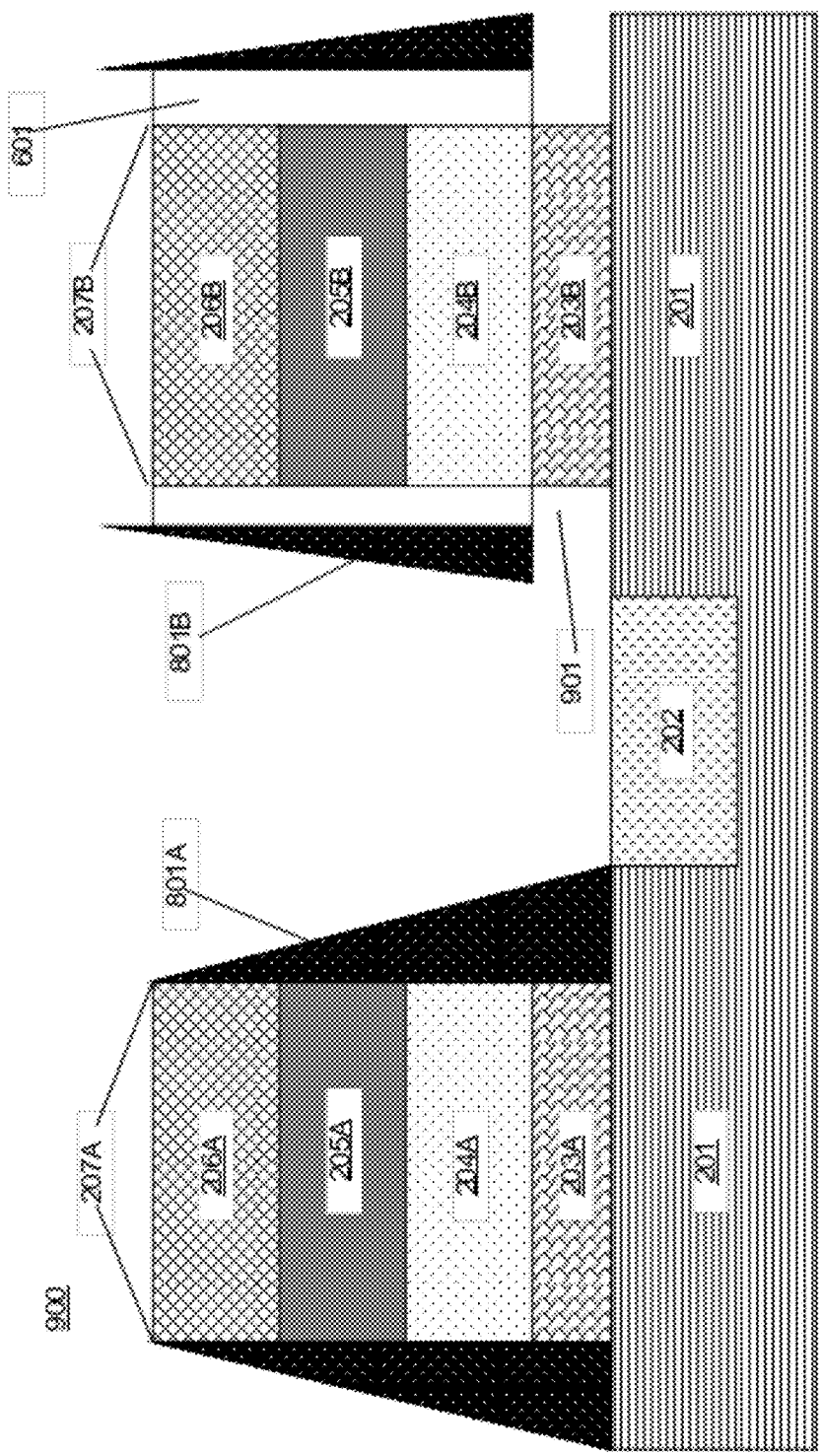
FIG. 9 is a cross sectional view illustrating an embodiment the device of FIG. 8 after partial removal of the oxide liner from the thick interfacial oxide device.

FIG. 1B illustrates another embodiment of a method 100B for fabrication of devices having different interfacial oxide thicknesses via lateral oxidation, including deposition of an oxide liner to protect the gate of the second device during the lateral oxidation step. FIG. 1B is discussed with respect to FIGS. 2 and 6-11. In block 101B, a plurality of devices are formed on a substrate, such as the devices shown in FIG. 2, as discussed above with respect to block 101A of FIG. 1A. In block 102B, an oxide liner 601 is formed over both the first device 207A and the second device 207B, as shown in FIG. 6. Oxide liner 601 may be formed by deposition. Then, in block 103B, the portion of oxide liner 601 that is located on first device 207A is selectively removed, as shown in FIG. 7, and spacers comprising oxidation-resistant material 801A and 801B are formed on both first device 207A and second device 207B. Oxidation-resistant material 801A-B may be a nitride such as $Si_3N_4$, and may be formed by deposition of the oxidation-resistant material, and photoresist and/or hardmask patterning followed by reactive ion etching to form the spacers. Oxidation-resistant material 801A encapsulates the interfacial oxide region 203A of first device 207A. In block 104B, oxide liner 601 is partially removed from second device 207B to allow access through recess 901 to interfacial oxide 203B, as shown in FIG. 9. Oxidation-resistant material 801B prevents removal of oxide liner 601 from the gate region (including dielectric layer 204B, gate metal 205B, and gate silicon 206B) of second device 207B.

Figure 10:
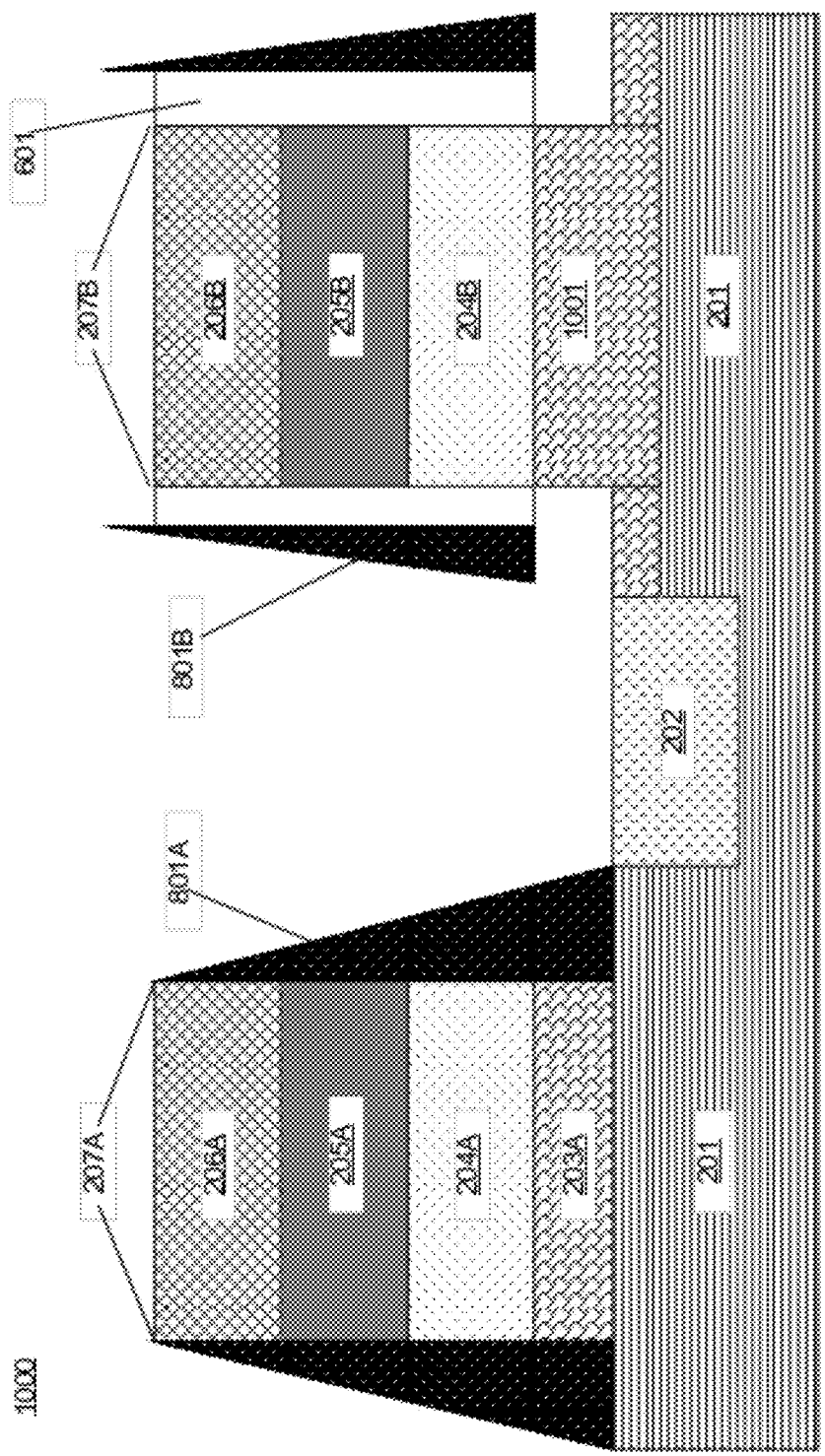
FIG. 10 is a cross sectional view illustrating an embodiment the device of FIG. 9 after lateral oxidation of the interfacial oxide of the thick interfacial oxide device.

In block 105B, lateral oxidation of the interfacial oxide 203B of second device 207B is performed, resulting in thick interfacial oxide 1001 in second device 207B as shown in FIG. 10. Oxide liner 601 prevents oxidation of dielectric layer 204B, gate metal 205B, and gate silicon 206B during lateral oxidation of interfacial oxide 203B. The lateral oxidation of block 105B converts a portion of substrate 201 that is located underneath second device 207B into interfacial oxide for second device 207B, and also forms excess oxide in substrate 201 adjacent to second device 207B. Conditions for the lateral oxidation of block 105B may be chosen such that the interfacial oxide 1001 grows into substrate 201 by a pre-determined amount. The lateral oxidation may be performed in a chamber at a low oxygen partial pressure at an appropriately chosen temperature in a range from about 400° C. to about 800° C. (about 700° C. in some embodiments), such that lateral diffusion of oxygen into the gate stack of second device 207B is sufficiently rapid compared to the oxidation rate of the substrate 201 to nearly equilibrate the effective oxygen partial pressure in the stack across the second device 207B. The lateral oxidation of block 105B may include an initial slow temperature ramp-up in an environment that contains the low partial pressures of inadvertent oxygen. The lateral oxidation time, including the relatively slow ramp up to the relatively high temperature, may be in a range from about 1 minute to about 1 day (about 1 hour in some embodiments). The lateral oxidation time and temperature may be adjusted depending on the gate length of the thick interfacial oxide devices. A high temperature and a relatively long time period for the lateral oxidation of block 105B allows for formation of thickened interfacial oxide, such as interfacial oxide 1001, for devices having relatively large gate lengths.

Figure 11:
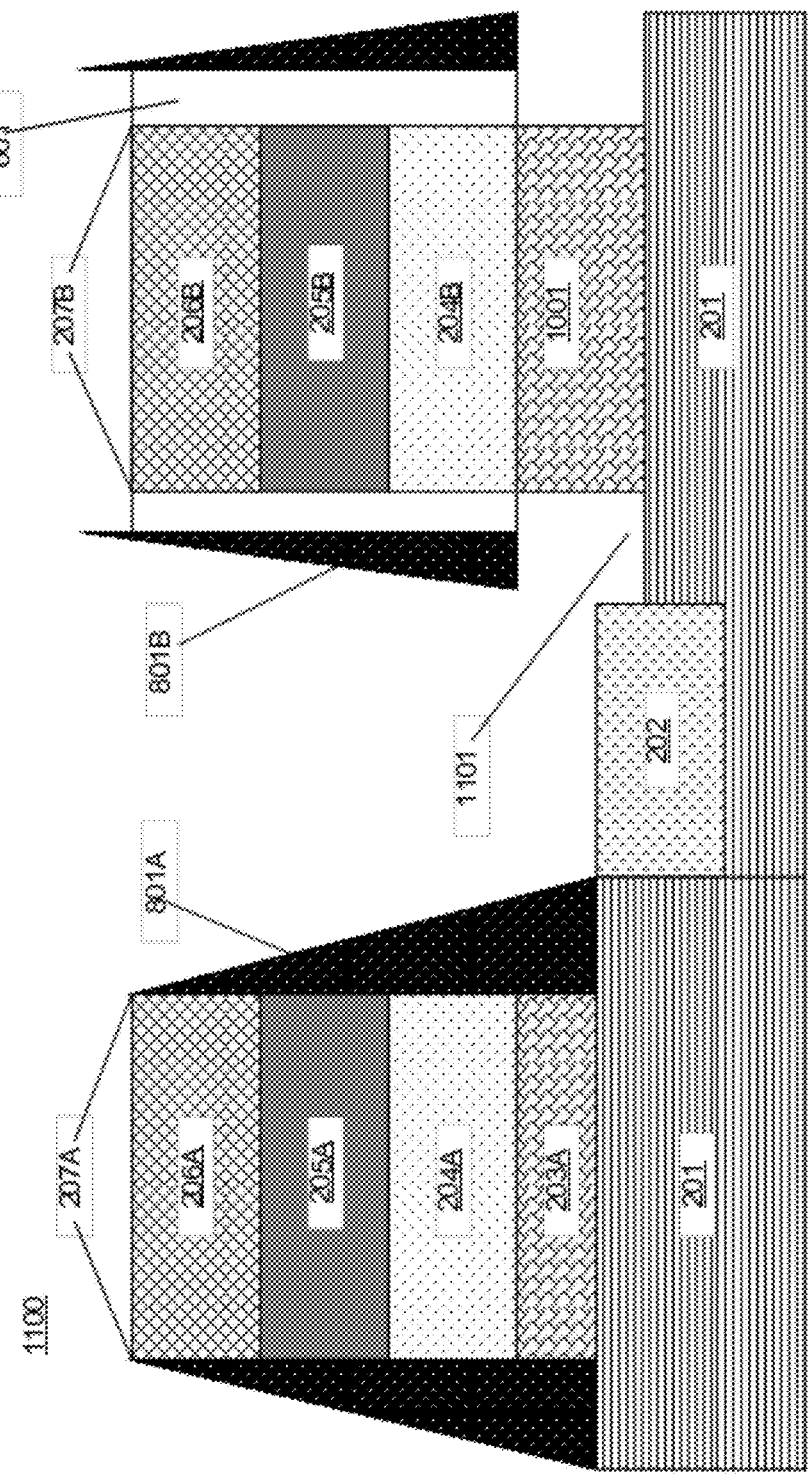
FIG. 11 is a cross sectional view illustrating an embodiment the device of FIG. 10 after removal of excess oxide from the substrate.

Lastly, in block 106B, excess oxide is removed from substrate 201, forming recesses 1101 adjacent to second device 207B in the substrate 201, as shown in FIG. 11. After the excess oxide is removed to form recesses 1101, oxidation-resistant material 801A may be removed from first device 207A, and oxide liner 601 and oxidation-resistant material 801B may be removed from second device 207B. Gate silicon 206A-B and source/drain regions in substrate 201 adjacent to first and second devices 207A-B may then be silicided in some embodiments; source/drain silicide for second device 207B is formed in recesses 1101. After formation of the gate and source/drain silicide, spacers (not shown) may then be formed on both first device 207A and second device 207B in some embodiments.

First device 207A and second device 207B are shown for illustrative purposes only; embodiments of method 100 may be used to thicken an interfacial oxide layer that is located on a semiconductor substrate for any appropriate type of device. For example, method 100 may be applied to gate-first devices such as metal-inserted poly-Si stack (MIPS) or full metal gate devices, or alternatively to replacement gate devices, in various embodiments. Further, any appropriate number of thin and thick interfacial oxide devices may be formed on the substrate.

The technical effects and benefits of exemplary embodiments include formation of devices with differing interfacial oxide thickness that may be applied to devices having a wide range of gate lengths.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A semiconductor device, comprising:
a first field effect transistor (FET) and a second FET located on a substrate, the first FET comprising a first interfacial oxide layer, and the second FET comprising a second interfacial oxide layer, wherein the second interfacial oxide layer of the second FET is thicker than the first interfacial oxide layer of the first FET and wherein a bottom surface of the second interfacial oxide layer non-planar with a bottom surface of the first interfacial oxide layer; and
a recess located in the substrate directly adjacent to a gate stack of the second FET.

2. The semiconductor device of claim 1, wherein the first and second interfacial oxide layers comprise one of silicon oxide and silicon oxynitride.

3. The semiconductor device of claim 1, wherein the substrate comprises one of silicon and silicon germanium.

4. The semiconductor device of claim 1, wherein the first FET comprises the first interfacial oxide layer located on the substrate, a first high-k dielectric layer located on the first interfacial oxide layer, and a first gate metal layer located on the first high-k dielectric layer; and
wherein the second FET comprises the second interfacial oxide layer located on the substrate, a second high-k dielectric layer located on the second interfacial oxide layer, and a second gate metal layer located on the second high-k dielectric layer.

5. The semiconductor device of claim 1, further comprising an oxide liner located over a gate of the second FET, and oxidation-resistant material located over the oxide liner.

6. The semiconductor device of claim 1, further comprising an oxidation-resistant material encapsulating the first FET.

* * * * *